(12) United States Patent
Chen et al.

(10) Patent No.: US 10,888,014 B2
(45) Date of Patent: Jan. 5, 2021

(54) SLIDE RAIL MECHANISM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/961,897

(22) Filed: Apr. 25, 2018

(65) Prior Publication Data

US 2019/0132986 A1    May 2, 2019

(30) Foreign Application Priority Data

Oct. 31, 2017   (TW) .............................. 106137836 A (51) Int. Cl.
*H05K 7/14*    (2006.01)
*H05K 7/18*    (2006.01)

(52) U.S. Cl.
CPC ......... *H05K 7/1491* (2013.01); *H05K 7/1489* (2013.01); *H05K 7/183* (2013.01)

(58) Field of Classification Search
CPC .... H05K 7/1491; H05K 7/1489; H05K 7/183; H05K 7/1488; H05K 5/217; H05K 5/0247; H02G 3/22; H02G 3/04
See application file for complete search history.

(56) References Cited

U.S. PATENT DOCUMENTS

| | | | | |
|---|---|---|---|---|
| 5,170,008 A | * | 12/1992 | Evans | H02G 3/0616 16/2.1 |
| 6,263,634 B1 | * | 7/2001 | Bodnar | E04C 3/09 16/2.1 |
| 6,305,556 B1 | | 10/2001 | Mayer | |
| 6,393,658 B1 | * | 5/2002 | Chong | A47B 21/06 16/2.2 |
| 6,554,697 B1 | * | 4/2003 | Koplin | G06F 1/206 454/184 |
| 6,600,665 B2 | | 7/2003 | Lauchner | |
| 6,646,893 B1 | | 11/2003 | Hardt | |
| 6,957,878 B2 | * | 10/2005 | Greenwald | A47B 88/43 312/223.1 |
| 7,275,646 B2 | * | 10/2007 | Mimlitch, III | H05K 7/186 211/26 |
| 7,388,156 B2 | * | 6/2008 | Knagge | H02G 3/22 16/2.1 |
| 7,569,772 B2 | * | 8/2009 | McClellan | H04Q 1/06 174/69 |

(Continued)

FOREIGN PATENT DOCUMENTS

JP      S64-50478 U     3/1989

*Primary Examiner* — Patrick D Hawn
(74) *Attorney, Agent, or Firm* — Winston Hsu (57) ABSTRACT

A slide rail mechanism includes a slide rail and a bracket device. The bracket device is arranged to the slide rail. Wherein one of the slide rail and the bracket device includes a structure feature for communicating with two opposite sides of the slide rail mechanism.

11 Claims, 6 Drawing Sheets

(56) References Cited

U.S. PATENT DOCUMENTS

| | | | | |
|---|---|---|---|---|
| 8,690,273 B2* | 4/2014 | Dolinsek | ............... | F25D 23/028 |
| | | | | 312/401 |
| 8,791,367 B2* | 7/2014 | Hartman | ................. | H02G 3/22 |
| | | | | 174/152 G |
| 8,925,739 B2* | 1/2015 | Crippen | ............... | H05K 7/1488 |
| | | | | 211/26 |
| 9,338,922 B2* | 5/2016 | Mick | ................... | H05K 7/1491 |
| 9,642,270 B2* | 5/2017 | Lewis, II | ............. | H05K 5/0234 |
| 9,719,717 B2* | 8/2017 | Dolinsek | ............... | F25D 23/028 |
| 9,913,397 B2 | 3/2018 | Miwa | | |
| 10,066,868 B2* | 9/2018 | Dolinsek | ............. | E05D 11/0081 |
| 2004/0201335 A1* | 10/2004 | Davis | ...................... | G06F 1/181 |
| | | | | 312/265.3 |
| 2005/0258721 A1* | 11/2005 | Hung | .................. | H05K 7/1491 |
| | | | | 312/223.1 |
| 2005/0259383 A1* | 11/2005 | Ewing | .................... | H02B 1/306 |
| | | | | 361/622 |
| 2008/0237408 A1 | 10/2008 | McClellan | | |
| 2011/0001408 A1* | 1/2011 | Caveney | ............. | G02B 6/4471 |
| | | | | 312/296 |
| 2011/0234074 A1* | 9/2011 | Dolinsek | ............... | F25D 23/028 |
| | | | | 312/404 |
| 2012/0007478 A1* | 1/2012 | Fan | ...................... | H05K 7/1488 |
| | | | | 312/223.2 |
| 2012/0292267 A1 | 11/2012 | Goldenberg | | |
| 2014/0167591 A1* | 6/2014 | Dolinsek | ............... | F25D 23/028 |
| | | | | 312/405 |
| 2014/0268528 A1 | 9/2014 | Mick | | |
| 2015/0069899 A1* | 3/2015 | Han | ..................... | F25D 25/025 |
| | | | | 312/404 |
| 2016/0037667 A1 | 2/2016 | Wu | | |

* cited by examiner

SLIDE RAIL MECHANISM

BACKGROUND OF THE INVENTION

1. Field of the Invention

This invention relates to a slide rail mechanism, and more particularly, to a slide rail mechanism capable of mounting an electric apparatus to a rack.

2. Description of the Prior Art

Figure 1:
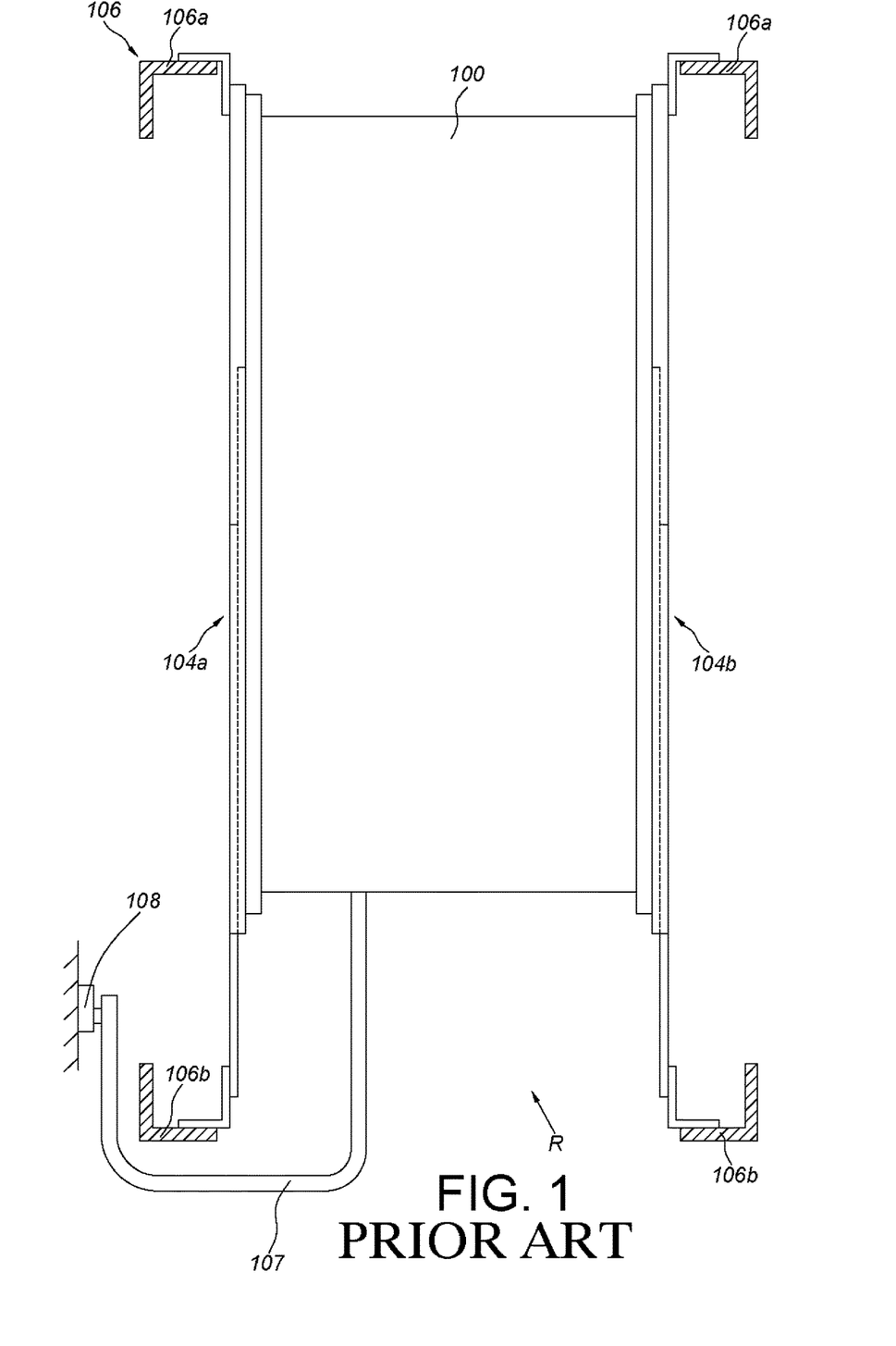
FIG. 1 is a diagram showing a first electric apparatus being mounted to a rack through a slide rail mechanism in the prior art.
Figure 2:
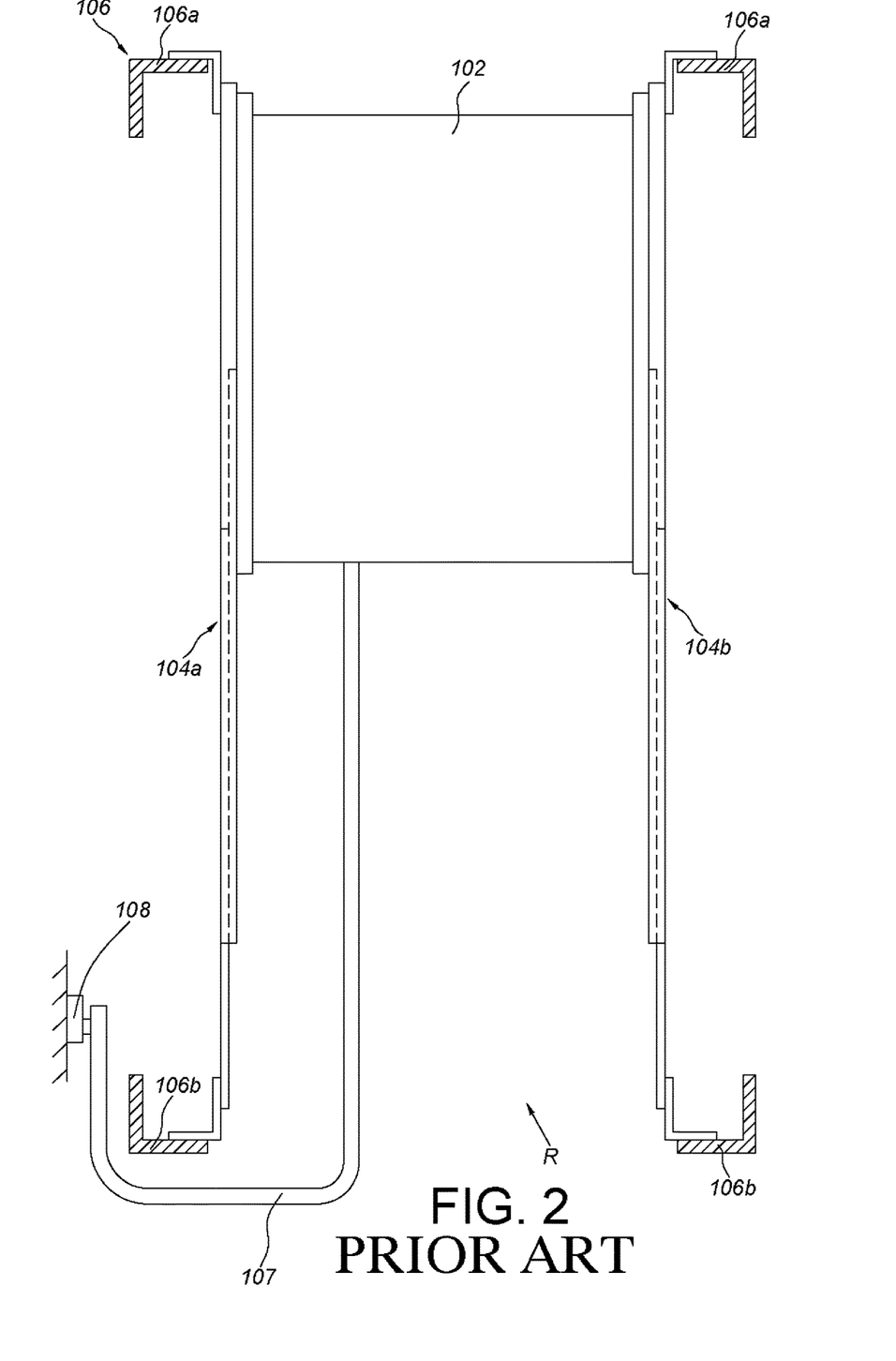
FIG. 2 is a diagram showing a second electric apparatus being mounted to the rack through the slide rail mechanism in the prior art.

As FIG. 1 and FIG. 2 shown, in a rack system, two sides of an electric apparatus, such as a first electric apparatus 100 with a first length (as shown in FIG. 1) or a second electric apparatus 102 with a second length (as shown in FIG. 2), are capable of being mounted to two pairs of posts 106a, 106b of a rack 106 via a pair of slide rail mechanisms 104a, 104b.

In related prior arts, maintainers usually need to walk to a rear side R along lateral sides of the slide mechanisms 104a, 104b or the rack 106 to obtain a cable 107 of these electric apparatuses 100, 102. The cable 107 can be a power line or a transmission line and is configured to be electrically connected to an object 108. The object 108, for example, is a power supply or an electric device. However, since the maintainers can only obtain the cable 107 of these electric apparatuses 100, 102 through the rear side R of the slide rail mechanisms 104a, 104b or the rack 106, it is inconvenient for the maintainers to maintain apparatus.

SUMMARY OF THE INVENTION

The present invention relates to a slide rail mechanism adapted to an electric device.

According to one aspect of the present invention, a slide rail mechanism adapted to mount an electric apparatus to a rack is provided. The slide rail mechanism includes a first rail and a bracket device. The bracket device is arranged to the first rail and mounted to the rack. Wherein, the electric apparatus is arranged on a first side of the slide rail mechanism, and one of the first rail and the bracket device includes a structure feature. The structure feature communicates the first side and a second side opposite to the first side of the slide rail mechanism. Wherein, the structure feature is configured to allow a cable of the electric apparatus to pass through.

Preferably, one of the first rail and the bracket device includes a first wall, a second wall and a side wall connected between the first wall and the second wall. The first wall, the second wall and the side wall cooperatively define a space. The structure feature is disposed on the side wall, and the slide rail mechanism further includes a strengthening part accommodated in the space.

Preferably, the strengthening part includes a first supporting wall, a second supporting wall and a middle wall connected between the first supporting wall and the second supporting wall. The first supporting wall, the second supporting wall and the middle wall are respectively located corresponding to the first wall, the second wall and the side wall, and the middle wall includes a corresponding feature adjacent to the structure feature.

Preferably, the strengthening part further includes a first engaging portion, and the first engaging portion is configured to be engaged with a second engaging portion of the side wall.

Preferably, the structure feature is a cable through hole.

Preferably, the slide rail mechanism further includes a second rail movable relative to the first rail.

Preferably, the bracket device includes a mounting member, and the mounting member is configured to be mounted to a post of the rack.

Preferably, the bracket device is mounted on the first rail via a reinforcement member.

According to another aspect of the present invention, a slide rail mechanism with a cable through hole or a structure feature communicating two sides of the slide rail mechanism is provided.

The slide rail mechanism including a first rail, a bracket and a bracket device is provided. The first rail has a first end portion and a second end portion. The bracket is connected adjacent to the second end portion of the first rail. The bracket device is connected adjacent to the first end portion of the first rail, and a cable through hole is disposed on the bracket device.

The slide rail mechanism including a first rail and a bracket device is provided. The bracket device is arranged to the first rail. Wherein, one of the first rail and the bracket device includes a structure feature configured to communicate two sides of the slide rail mechanism.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
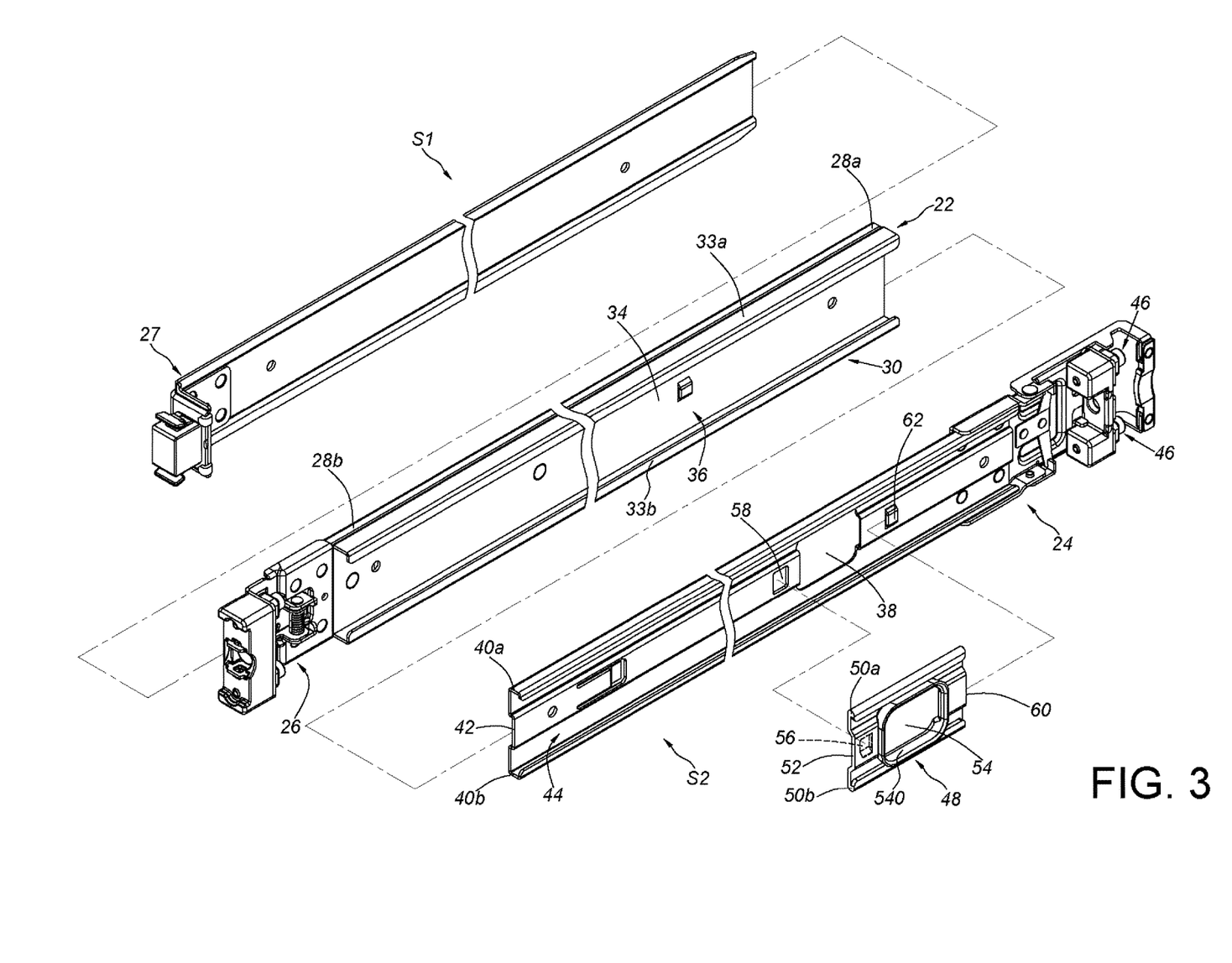
FIG. 3 is an exploded diagram of the slide rail mechanism according to an embodiment of the present invention.
Figure 4:
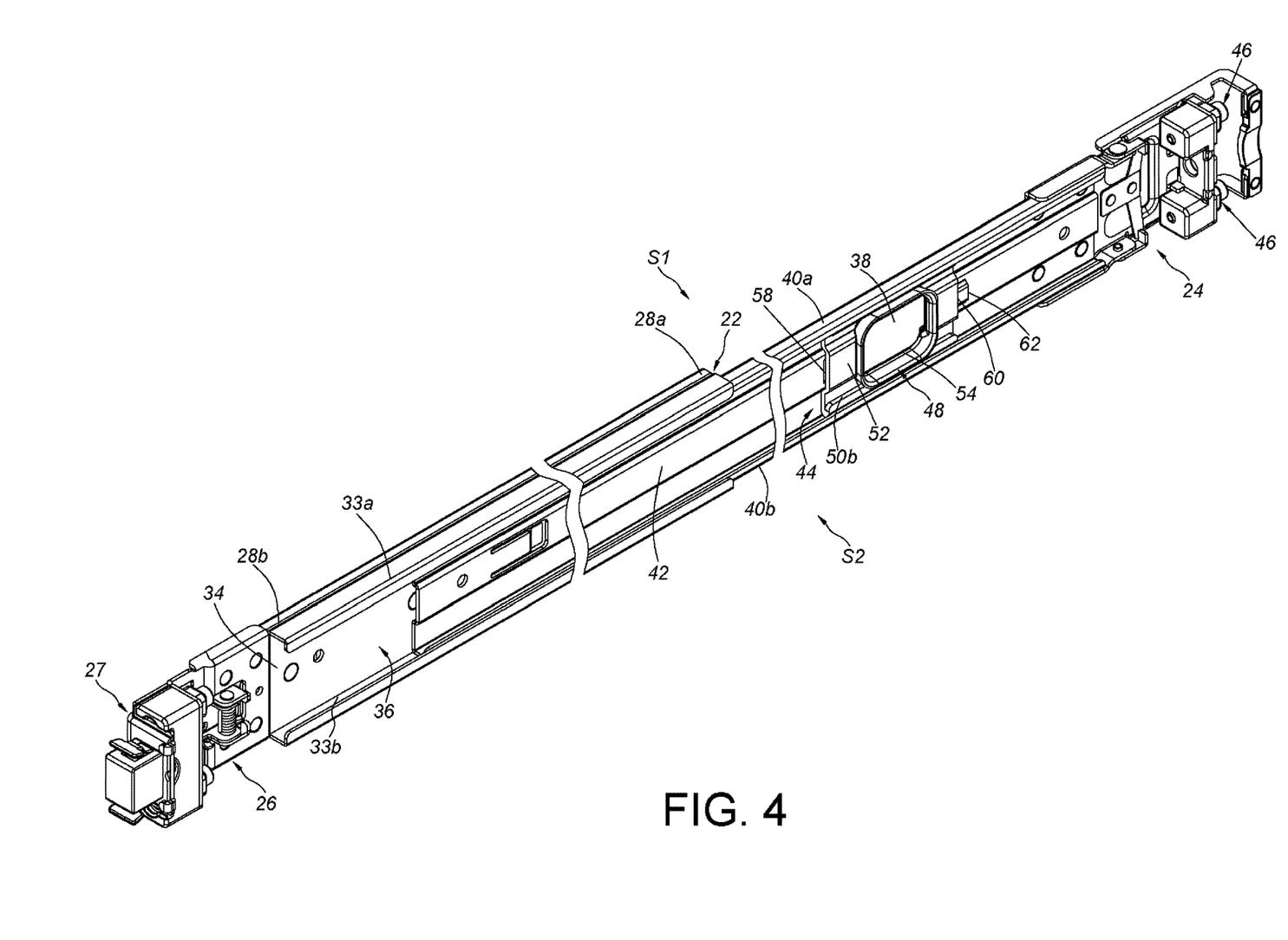
FIG. 4 is an assembly diagram of the slide rail mechanism according to the embodiment of the present invention.

As shown in FIG. 3 and FIG. 4, a slide rail mechanism according to an embodiment of the present invention has a first side S1 and a second side S2. Preferably, the first side S1 and the second side S2 are opposite sides.

The slide rail mechanism includes a first rail 22 and a bracket device 24. Hereinafter, the slide rail mechanism further including a bracket 26 and a second rail 27 is illustrative of an example.

The first rail 22 has a first end portion 28a and a second end portion 28b. The first end portion 28a and the second end portion 28b, for example, are a frontal end portion and a rear end portion, respectively, but the present invention is not limited thereto. On the other hand, the second rail 27 is able to displace relative to the first rail 22, so as to be in a retracted position or in an extended position. Hereinafter, the second rail 27 arranged at a front side of the first rail 22 is illustrative of an example.

The bracket 26 is connected adjacent to the second end portion 28b of the first rail 22. On the other hand, the bracket device 24 is arranged on the first rail 22. Preferably, the bracket device 24 is connected adjacent to the first end portion 28a of the first rail 22 via a reinforcement member 30 disposed on a back side of the first rail 22, wherein the reinforcement member 30 and the first rail 22 can be integrated as an integral part. For example, the reinforcement member 30 is fixedly connected to the back side of the first rail 22 and can be regarded as one portion of the first rail 22. Preferably, the reinforcement member 30 includes a first wall 33a, a second wall 33b and a side wall 34 connected between the first wall 33a and the second wall 33b. The first wall 33a, the second wall 33b and the side wall 34 cooperatively define a space 36.

One of the bracket device 24 and the first rail 22 includes a structure feature 38. The structure feature 38 is configured to communicate a first side S1 and a second side S2 of the slide rail mechanism. Hereinafter, the bracket device 24 including the structure feature 38 is illustrative of an example. Preferably, the structure feature 38 is a cable through hole, but the present invention is not limited thereto. Moreover, the bracket device 24 includes a first wall 40a, a second wall 40b and a side wall 42 connected between the first wall 40a and the second wall 40b of the bracket device 24. The first wall 40a, the second wall 40b and the side wall 42 define a space 44. The side wall 42 of the bracket device 24 is mounted to the first rail 22 via the reinforcement member 30. Hereinafter, it is illustrative of an example that the side wall 42 of the bracket device 24 is able to move relative to the first rail 22 via the space 36 of the reinforcement member 30, and the cable through hole is formed on the side wall 42. Preferably, the bracket device 24 further includes a mounting member 46 and the mounting member 46 is arranged to an end position of the side wall 42 of the bracket device 24.

Preferably, the slide rail mechanism further includes a strengthening part 48 accommodated in the space 44 of the bracket device 24. The strengthening part 48 includes a first supporting wall 50a, a second supporting wall 50b and a middle wall 52 connected between the first supporting wall 50a and the second supporting wall 50b, wherein the first supporting wall 50a, the second supporting wall 50b and the middle wall 52 are respectively located corresponding to the first wall 40a, the second wall 40b and the side wall 42 of the bracket device 24 and are able to sustain each other. The middle wall 52 includes a corresponding feature 54 adjacent to the structure feature 38. In the embodiment, the corresponding feature 54 is a supporting hole, and a location of the supporting hole corresponds to that of the structure feature 38.

Preferably, the first supporting wall 50a and the first wall 40a are bending portions and are able to sustain each other. The second supporting wall 50b and the second wall 40b are bending portions and are able to sustain each other. Thereby, supporting intensity of the slide rail mechanism can be enhanced.

Preferably, the strengthening part 48 further includes a first engaging portion 56, and the first engaging portion 56 is configured to be engaged with a second engaging portion 58 of the side wall 42 of the bracket device 24. For example, the first engaging portion 56 and the second engaging portion 58 are a combination of a convex structure and a concave (or a hole) structure. The aforesaid combination enables the strengthening part 48 to be detachably connected to the bracket device 24.

In FIG. 3, it is noticed that the strengthening part 48 can further includes a flange 540. The flange 540 protrudes from the middle wall 52 of the strengthening part 48 and located around the corresponding feature 54 (i.e., the supporting hole). The flange 540 conduces to prevent abrasion between the cable and the strengthening part 48. In other words, the flange 540 reduces sharpness of an edge surrounding the corresponding feature 54 (i.e., the supporting hole), which results in protection of the cable from being damaged by the edge of the supporting hole. Besides, the flange 540 enhances structural strength of the strengthening part 48.

Preferably, the strengthening part 48 further includes a first abutting portion 60, and the first abutting portion 60 is configured to cooperate with a second abutting portion 62 of the side wall 42 of the bracket device 24. For example, the first abutting portion 60 and the second abutting portion 62 can abut against each other, so as to increase structural strength and/or reliability as the strengthening part 48 is mounted on the side wall 42.

Figure 5:
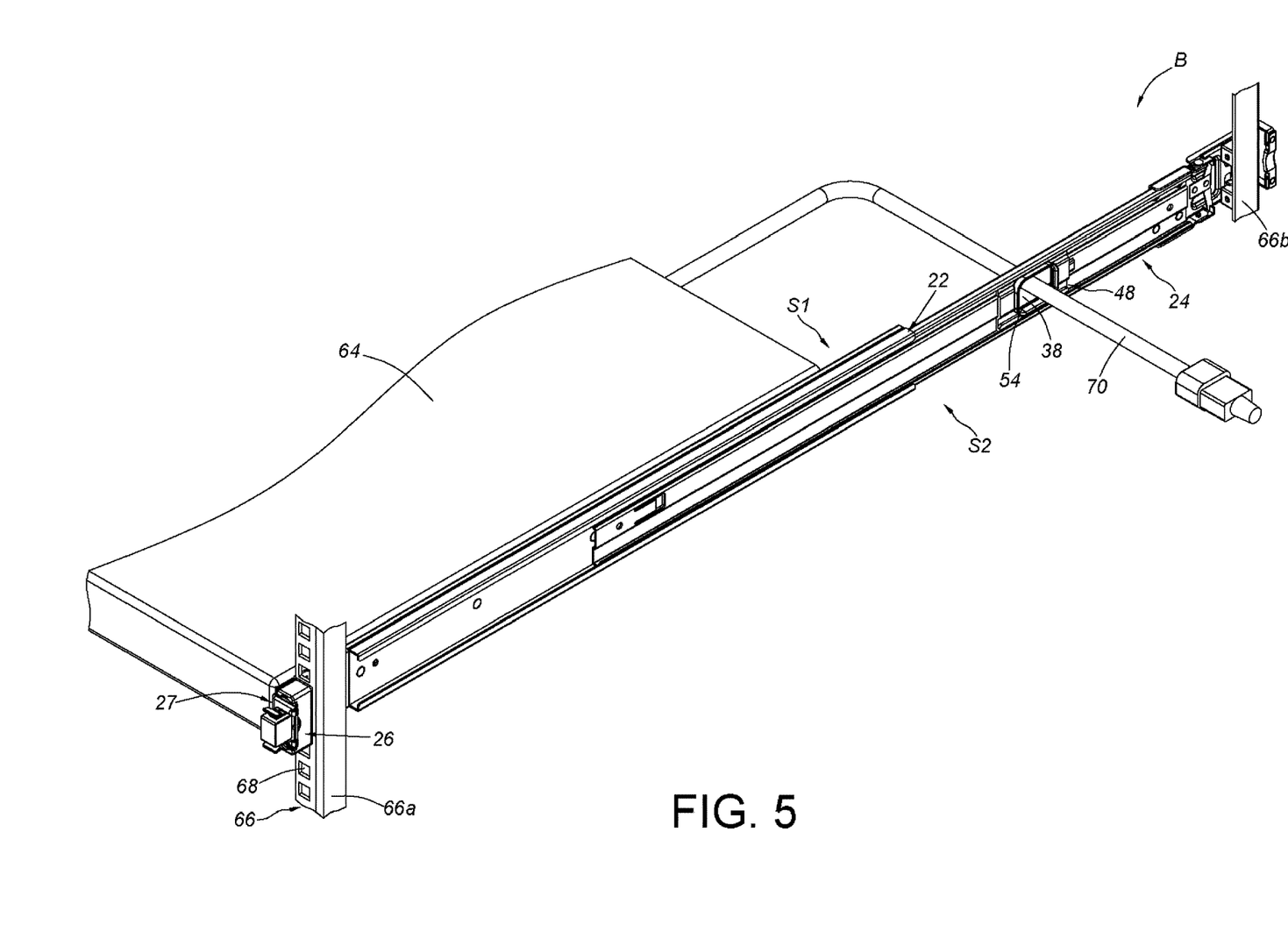
FIG. 5 is a diagram showing that the slide rail mechanism mounts an electric apparatus to the rack, and a cable is disposed from a side to another side opposite to the side of the slide rail mechanism according to the embodiment of the present invention.

As shown in FIG. 5, the slide rail mechanism is adapted to mount an electric apparatus 64 to a rack 66. Specifically, the electric apparatus 64, for example, is a server, a hard disk or a power distribution unit and so on, but the present invention is not limited thereto. The rack 66 includes a first post 66a and a second post 66b, and these posts 66a, 66b both have a plurality of mounting holes 68 (the mounting holes of the second post 66b are not shown due to the perspective).

Furthermore, the first rail 22 of the slide rail mechanism is mounted to the first post 66a via the bracket 26, and the first rail 22 is mounted to the second post 66b via (the said mounting part 46 of) the bracket device 24. Since this part is well-known by one of ordinary skill in the art, the detailed description is omitted herein for simplicity.

The electric apparatus 64 is arranged on the first side S1 of the slide rail mechanism. The electric apparatus 64 can be disposed on one of the first rail 22 and the second rail 27 in order that the electric apparatus 64 is mounted and supported. Hereinafter, the electric apparatus 64 disposed on the second rail 27 is illustrative of an example. Thereby, the electric apparatus 64 can be moved from an inside of the rack 66 to an outside of the rack 66, or be moved into the rack 66 from the outside of the rack 66 via the second rail 27.

The structure feature 38 communicates the first side S1 and the second side S2 of the slide rail mechanism. Specially, the structure feature 38 allows a cable 70 to pass through. For example, the cable 70 can pass through the structure feature 38 (and the corresponding feature 54 of the strengthening part 48) from the first side S1 of the slide rail mechanism. As a result, the cable 70 is exposed on the second side S2 or disposed to the second side S2. The aforesaid arrangement facilitates the maintainer to access the cable 70 on the lateral side (e.g., the second side S2) directly, so as to enhance convenience of operation.

Figure 6:
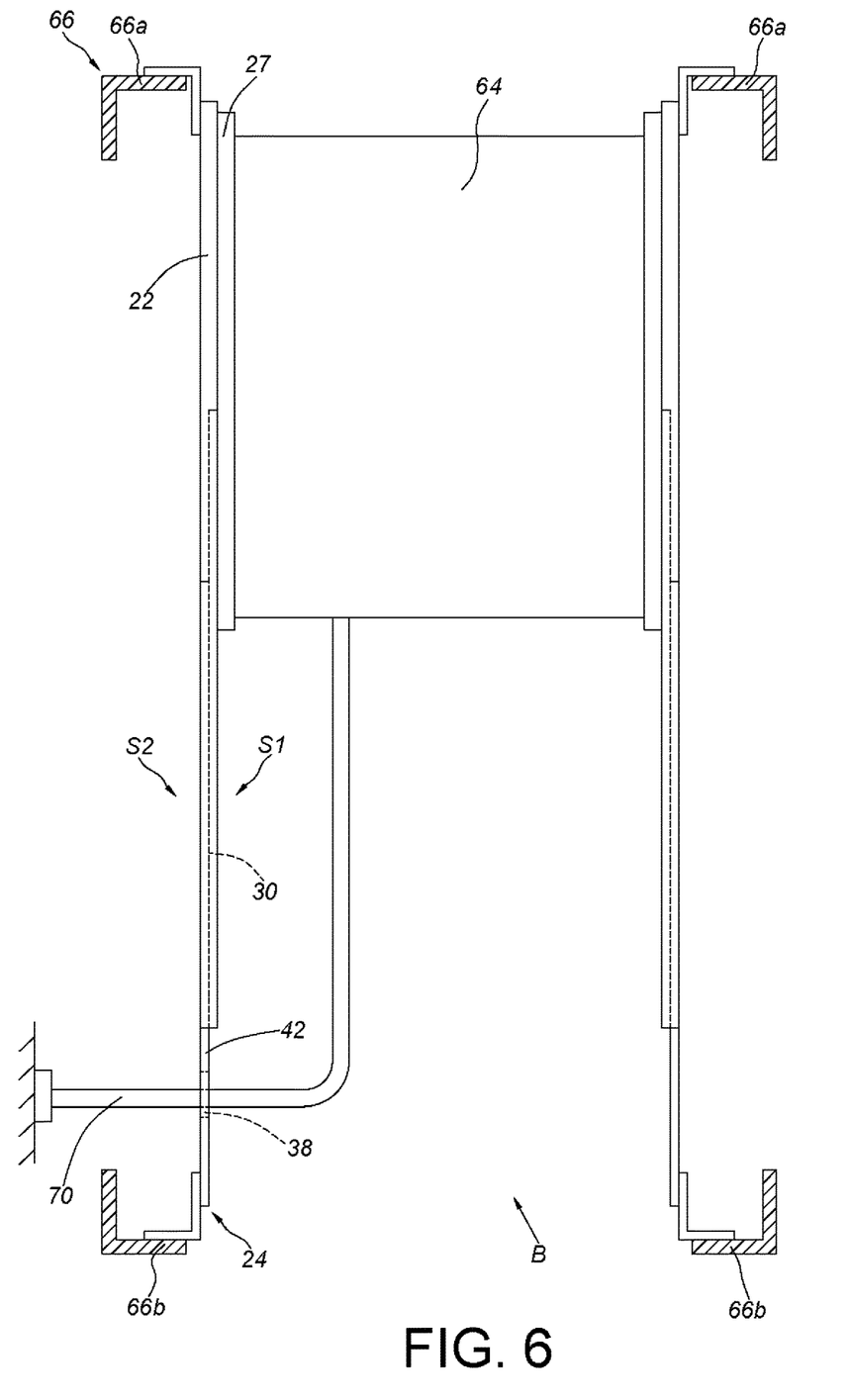
FIG. 6 is a diagram showing that the slide rail mechanism mounts an electric apparatus to the rack according to the embodiment of the present invention.

As shown in FIG. 6, the electric apparatus 64 is mounted to two pairs of first posts 66a and second posts 66b via a pair of slide rail mechanism. Wherein, one of the pair of the slide rail mechanism has the structure feature 38, and maintainers can get the cable 70 directly on the side (for example, the second side S2) of the slide rail or the rack 66 through the structure feature 38. In other words, according to this configuration, the problem that maintainers need to walk to one end position of the slide rail mechanism or the rack 66 (for example, the rear position B) to obtain the cable 70 can be solved.

Accordingly, the embodiment of the present invention includes following features:

1. The slide mechanism has a first side S1 and a second side S2, and one of the bracket device 24 and the first rail 22 includes the structure feature 38, which communicates the first side S1 and the second side S2 of the slide rail mechanism. When the electric apparatus 64 is arranged on the first side S1 of the slide rail mechanism, maintainers can obtain the cable 70 of the electric apparatus 64 on the second side S2 of the slide rail mechanism.

2. The strengthening part 48 and the bracket device 24 can sustain each other so as to increase the structural intensity. The strengthening part 48 has the corresponding feature 54 which is adjacent to the structure feature 38 so as to assist the slide rail mechanism to support the cable 70.

3. The strengthening part 48 is detachably connected to the bracket device 24, so that it can be attached depending on needs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism adapted to mount an electric apparatus to a rack, the rack having a first post and a second post, the electric apparatus having at least one cable, a rear surface and two side surfaces, the two side surfaces being opposite to each other, the rear surface being connected between the two side surfaces, the at least one cable extending from the rear surface of the electric apparatus, a lateral side of the rack being defined between the first post and the second post and corresponding to one of the two side surfaces of the electric apparatus, the slide rail mechanism comprising:
   a first rail having a first end portion and a second end portion;
   a bracket device arranged to the first rail, the bracket device being connected adjacent to the first end portion of the first rail; and
   a bracket connected adjacent to the second end portion of the first rail;
   wherein the second end portion of the first rail is mounted to the first post via the bracket, and the first end portion of the first rail is mounted to the second post via the bracket device;
   wherein the electric apparatus is arranged on a first side of the slide rail mechanism, one of the first rail and the bracket device comprises a structure feature, and the structure feature communicates the first side and a second side opposite to the first side of the slide rail mechanism;
   wherein the structure feature is configured to allow the at least one cable of the electric apparatus to pass through;
   wherein the first rail is arranged on one of the two side surface of the electric apparatus and oriented along a longitudinal direction, such that the structure feature is provided for passing the at least one cable from the one of the two side surfaces of the electric apparatus and from the lateral side of the rack to the outside of the rack, wherein the longitudinal direction is defined by a displacement direction along which the second rail moves relative to the first rail;
   wherein one of the first rail and the bracket device comprises a first wall, a second wall and a side wall connected between the first wall and the second wall, the first wall, the second wall and the side wall cooperatively define a space, the structure feature is disposed on the side wall, and the slide rail mechanism further comprises a strengthening part accommodated in the space;
   wherein the strengthening part comprises a first supporting wall, a second supporting wall and a middle wall connected between the first supporting wall and the second supporting wall, the first supporting wall, the second supporting wall and the middle wall are respectively located corresponding to the first wall, the second wall and the side wall, and the middle wall comprises a corresponding feature adjacent to the structure feature;
   wherein the first supporting wall and the first wall are bending portions and are able to sustain each other; the second supporting wall and the second wall are bending portions and are able to sustain each other.

2. The slide rail mechanism of claim 1, wherein the strengthening part further comprises a first engaging portion, and the first engaging portion is configured to be engaged with a second engaging portion of the side wall.

3. The slide rail mechanism of claim 1, wherein the structure feature is a cable through hole.

4. The slide rail mechanism of claim 1, further comprising a second rail movable relative to the first rail.

5. The slide rail mechanism of claim 1, wherein the bracket device comprises a mounting member, and the mounting member is configured to be mounted to a post of the rack.

6. The slide rail mechanism of claim 5, wherein the bracket device is mounted on the first rail via a reinforcement member, the reinforcement member comprises a first wall, a second wall and a side wall connected between the first wall and the second wall, a space is defined by the first wall, the second wall and the side wall, the bracket device is accommodated in the space and is able to move relative to the first rail via the space.

7. The slide rail mechanism of claim 1, wherein the bracket device is arranged along a longitudinal direction of the first rail, the electric apparatus is movable relative to the bracket device along the longitudinal direction, wherein the longitudinal direction is defined by a displacement direction along which the second rail moves relative to the first rail.

8. A slide rail mechanism applicable to a rack, the rack having a first post and a second post, an electric apparatus having at least one cable, a rear surface and two side surfaces, the two side surfaces being opposite to each other, the rear surface being connected between the two side surfaces, the at least one cable extending from the rear surface of the electric apparatus, a lateral side of the rack being defined between the first post and the second post and corresponding to one of the two side surfaces of the electric apparatus, the slide rail mechanism comprising:
   a first rail having a first end portion and a second end portion;
   a bracket device arranged to the first rail, the bracket device being connected adjacent to the first end portion of the first rail; and
   a bracket connected adjacent to the second end portion of the first rail;

wherein the second end portion of the first rail is mounted to the first post via the bracket, and the first end portion of the first rail is mounted to the second post via the bracket device;

wherein one of the first rail and the bracket device comprises a structure feature configured to communicate two sides of the slide rail mechanism;

wherein the first rail is arranged on one of the two side surface of the electric apparatus and oriented along a longitudinal direction, such that the structure feature is provided for passing the at least one cable from the one of the two side surfaces of the electric apparatus and from the lateral side of the rack to the outside of the rack, wherein the longitudinal direction is defined by a displacement direction along which the second rail moves relative to the first rail;

wherein one of the first rail and the bracket device comprises a first wall, a second wall and a side wall connected between the first wall and the second wall, the first wall, the second wall and the side wall cooperatively define a space, the structure feature is disposed on the side wall, and the slide rail mechanism further comprises a strengthening part accommodated in the space;

wherein the strengthening part comprises a first supporting wall, a second supporting wall and a middle wall connected between the first supporting wall and the second supporting wall, the first supporting wall, the second supporting wall and the middle wall are respectively located corresponding to the first wall, the second wall and the side wall;

wherein the first supporting wall and the first wall are bending portions and are able to sustain each other; the second supporting wall and the second wall are bending portions and are able to sustain each other.

9. The slide rail mechanism of claim 8, wherein the structure feature is a cable through hole, and the middle wall comprises a supporting hole located corresponding to the cable through hole.

10. The slide rail mechanism of claim 8, wherein the strengthening part comprises a first engaging portion, and the first engaging portion is engaged with a second engaging portion of the side wall.

11. The slide rail mechanism of claim 8, wherein the bracket device is arranged along a longitudinal direction of the first rail, the electric apparatus is movable relative to the bracket device along the longitudinal direction, wherein the longitudinal direction is defined by a displacement direction along which the second rail moves relative to the first rail.

* * * * *